July 9, 1968 R. ORDOWER 3,392,342

TRANSISTOR AMPLIFIER WITH GAIN STABILITY

Filed Dec. 13, 1965

INVENTOR
ROBERT ORDOWER

BY John C. Black
ATTORNEY

United States Patent Office 3,392,342
Patented July 9, 1968

3,392,342

TRANSISTOR AMPLIFIER WITH GAIN STABILITY

Robert Ordower, Vestal, N.Y., assignor to International Business Machines Corporation, Armonk, N.Y., a corporation of New York Filed Dec. 13, 1965, Ser. No. 513,395
19 Claims. (Cl. 330—22)

ABSTRACT OF THE DISCLOSURE

One or more matched diodes in the form of transistors having their base-collector electrodes short-circuited are connected directly across the base-emitter junctions of one or more matched transistor amplifiers to produce an output current from the amplifiers equal to the input current to the diodes multiplied by the number of amplifiers and divided by the number of diodes. Input current signals to be amplified are applied directly to the junction between the base-collector electrodes of the diodes and the base electrodes of the amplifiers, and output current signals are derived from the collector electrodes of the amplifiers.

Figure 1:
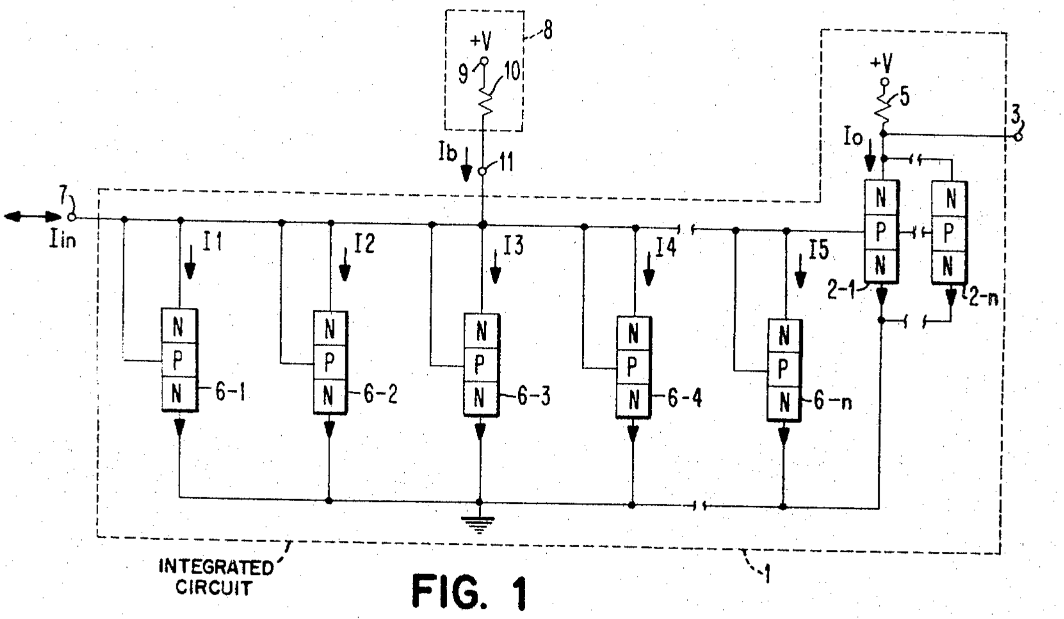

This application relates to an improved inverting transistor amplifier with significant gain stability.

In signal amplifying circuits, a stable gain characteristic is frequently of significant importance. Typical solutions to the problem result in circuit complexity to achieve very precise stability.

It is therefore a primary object of the present invention to provide a simplified transistor amplifier of the signal inverting type which exhibits high gain stability.

Transistor amplifiers of the signal inverting type are connected in a common emitter configuration and are usually utilized in a circuit arrangement wherein they present a relatively high input impedance to their drive source. The typical single stage, low input impedance amplifiers are of the noninverting, common base type and are subject to oscillation problems.

Known common emitter amplifiers having a low valued shunt resistance in the input circuit are subject to gain instability due to temperature, power supply, resistor and transistor variations.

Accordingly, it is a primary object of the present invention to provide an improved signal inverting amplifier characterized by a low input impedance and a high output impedance and which is further characterized by a selected gain level which is substantially independent of wide variations in temperature and/or supply voltage.

The above objects are achieved in the preferred embodiment of the invention by providing one or more parallel connected common emitter transistor amplifiers together with an input circuit including one or more additional transistors having their emitter and collector electrodes respectively connected directly to the emitter and base electrodes of the amplifier(s). Each of said additional transistors has its base electrode connected directly to its collector electrode to act as a diode.

The transistors are selected to have matched base-emitter characteristics. This can be achieved in a circuit which utilizes discrete transistor components by careful selection of the transistors with respect to their characteristics. However, with the advent of the monolithic fabrication of integrated circuits, the low cost fabrication of transistors with essentially identical characteristics is readily achieved on the same semiconductor chip. Consequently, the present invention is especially useful in monolithically fabricated circuits and has in fact been particularly adapted for such fabrication.

In one embodiment, a direct current bias supply is connected to the base-collector electrodes of each of said additional transistors and to the base electrode of one common emitter transistor amplifier to operate the transistors in their linear regions. To assure linear operation, the transistors have a higher base-emitter voltage drop than the collector-emitter drop when operated at saturation.

It will be appreciated that, in the preferred embodiment, the transistors are biased in their linear region and operate in their linear region in response to input signals; however, the teachings of the invention can be utilized in applications where the transistors also operate in non-linear regions.

The bias current divides equally between each of said additional transistors. The portion of said bias current which flows into the base electrode of the amplifier is negligible, inasmuch as its value is substantially the value of the current through one of said additional transistors divided by the beta of the transistor.

With the bias current so applied to the transistors, the collector output current of the common emitter transistor amplifier is equal to the current through each of the additional transistors irrespective of temperature and/or supply variations.

The additional transistors are preferably biased to operate in their linear region, and the impedance which each of said additional transistors exhibits can be varied from a relatively high value to a very low value by adjustment of its bias current. In addition, input impedance can be decreased by connecting in parallel as many of these additional transistors as is required and by suitably adjusting the bias current through each.

With one common emitter transistor amplifier and one of said additional transistors being used, unity current gain will be effected through the stage. If a gain greater than unity is desired, the number of common emitter transistor amplifiers must exceed the number of said additional transistors in the input circuit. A gain lower than unity is achieved by providing a greater number of said additional transistors than common emitter transistor amplifiers.

Accordingly, it is a more specific object of the present invention to provide an inverting amplifier having a low input impedance, a high output impedance and precise gain stability over wide variations in ambient temperature and voltage supplies, which amplifier is characterized by at least one common emitter transistor amplifier, by at least one additional transistor with its base and collector electrodes connected together and to the base electrode of the transistor amplifier and with its emitter electrode connected to the emitter electrode of the transistor amplifier, and by means biasing the transistors substantially in their region of linear operation.

Another object of the present invention is the provision of a monolithically fabricated inverting amplifier including at least one common emitter transistor amplifier and at least one additional transistor having its base and collector electrodes connected to the base electrode of the common emitter transistor and having its emitter electrode connected to the emitter electrode of the common emitter transistor for gain stability.

It will be appreciated that, in the event that the source of bias current comprises a suitable power supply terminal and a series resistor, this resistor need not be an accurately toleranced component. As the resistor value varies with temperature, it will in fact change the level at which the transistors operate. However, the operating levels of the additional transistors and the amplifiers change in the same manner so that the gain still remains unchanged.

In addition, the load resistor which is typically used in the collector circuit of the amplifier will vary in value with temperature; however this will not have any noticeable effect on the gain of the amplifier because the collector output current of the amplifier is equal to the bias currents through the additional transistors, irrespective of the value of said load resistance.

In a particular embodiment in which the amplifier of the present invention drives subsequent amplifier stages and negative feedback is provided from the output of said subsequent stages to assure linear operation, this feedback circuit will further determine the bias current into the initial amplifier of the present invention and its input transistors. Said bias current will be affected by the value of the load resistor in the amplifier of the present invention; however, since as in the previous instance the currents through the input transistors and the amplifier transistor of the present invention vary similarly, the gain of the stage will not be affected.

The foregoing and other objects, features and advantages of the invention will be apparent from the following more particular description of preferred embodiments of the invention, as illustrated in the accompanying drawings.

Figure 2:
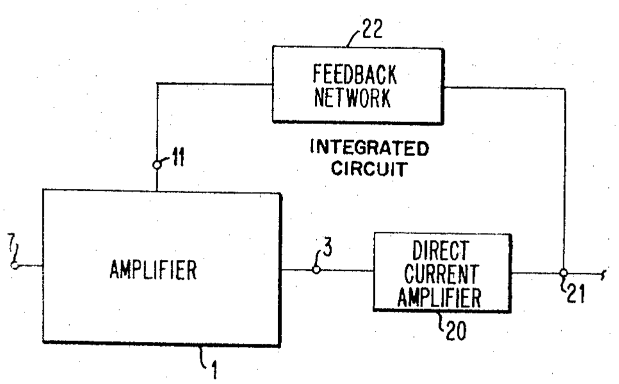

In the drawings:

FIG. 1 is a schematic diagram of a preferred form of the improved amplifier; and FIG. 2 diagrammatically illustrates a modification of the improved amplifier.

The improved amplifier 1 of FIG. 1 includes a plurality of common emitter transistor amplifiers 2–*l* to 2–*n* having their collector electrodes connected to an output terminal 3 and to a positive supply terminal 4 by way of a load resistor 5. The base electrodes of the amplifiers 2–*l* to 2–*n* are connected directly to the base and collector electrodes of a plurality of additional transistors 6–*l* to 6–*n*. The emitter electrodes of the latter transistors are connected to ground potential.

An input signal terminal 7 is connected to the base electrodes of the amplifiers 2–*l* to 2–*n* and to the base-collector electrodes of the transistors 6–*l* to 6–*n*. The input terminal is also connected to a source 8 of bias current I*b* by way of a terminal 11. In the embodiment of FIG. 1, the source 8 comprises a positive supply terminal 9 and a resistor 10.

It will be assumed that the base-emitter characteristics of the transistors 2–*l* to 2–*n* and 6–*l* to 6–*n* are the same and preferably, are of monolithic fabrication on the same chip. In the preferred embodiment, the current I*b* is such that the transistors 6–*l* to 6–*n* are operated in their linear region; the voltage at the base electrodes being approximately seven-tenths volt. In this respect, it will be appreciated that the transistor construction is such that this base-emitter voltage drop is higher than that which exists across the emitter-collector electrodes of the transistors 6–*l* to 6–*n* if they were operated in saturation. The voltage at the base electrode of the transistor amplifiers 2–*l* to 2–*n* are also at seven-tenths volt.

Therefore, the collector current I0 of each amplifier 2–*l* to 2–*n* is substantially equal to each of the collector currents I1, I2, etc., because the voltages at their base electrodes are identical. This relationship of the currents will remain constant with wide variations in temperature and supply voltages which can cause bias current variations.

The current gain of the stage is substantially equal to the ratio of the number of amplifiers 2–*l* to 2–*n* to the number of transistors 6–*l* to 6–*n*. For example, in the embodiment shown in FIG. 1 utilizing one amplifier 2–*l* and five transistors 6–*l* to 6–*n*, $I0=I1=I2=I3=I4=I5$; and the ratio of the input bias current to the output current I0 is five to one. Input signal current I*in* will divide equally between the transistors 6–*l* to 6–*n*. Therefore, the current gain of the stage is two-tenths.

The input impedance of the stage 1 is essentially the equivalent impedance of the individual impedances of the transistors 6–*l* to 6–*n* connected in parallel. In the event that a lower or higher input impedance is desired, the number of transistors 6–*l* to 6–*n* can be respectively increased or decreased; however, the gain of stage is proportionately decreased or increased.

Assuming that current drain from the power supply is no problem, the input impedance can be increased or decreased without changing the gain by respectively decreasing or increasing the bias current.

The total output current of the inverting amplifier 1 will be equal to the sum of the collector currents I0 through each of the amplifiers 2–*l* to 2–*n*. With one shunt transistor 6–*l* and two amplifiers 2–*l* and 2–*n*, the output current will be equal to twice I1 for a gain of two.

In FIG. 2, the amplifier 1 has its output terminal 3 connected to a direct current amplifier 20 of conventional construction. The output terminal 21 of the amplifier 20 is connected to the bias supply terminal 11 by way of a suitable negative feedback network 22. The feedback network 22 may be of conventional construction with the primary purpose of assuring a linear operation of the circuit comprising the amplifiers 1 and 20. This feedback network will, in a well-known manner, also set the bias current level I*b*. In this embodiment, the value of the resistor 5 (see FIG. 1) as it varies in response to changes in temperature, can affect the precise level of the current I*b*. However, changes in the current I*b* do not change the gain.

As indicated above, the amplifiers 2–*l* to 2–*n* (as well as the transistors 6–*l* to 6–*n*) are preferably biased to their linear regions of operation. Consequently, input signals applied to the terminal 7 will be linearly amplified by the amplifiers 2–*l* to 2–*n* and appear at the output terminal 3.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An inverting amplifier having a gain characteristic which is substantially independent of variations in temperature and bias current comprising:

at least one common emitter transistor amplifier having base and emitter electrodes;

an input circuit for said amplifier including at least one additional transistor having base-emitter characteristics which substantially match those of the transistor amplifier, having its base and collector electrodes connected directly to the base electrode of the transistor amplifier and having its emitted electrode connected directly to the emitter electrode of the transistor amplifier;

substantially zero impedance means applying input current which is to be amplified directly to the base electrode of each amplifier and directly to the base and collector electrodes of each additional transistor; and means supplying a predetermined bias current directly to the junction between said base and collector electrodes to operate the transistors at a selected level, whereby the collector output current of each transistor amplifier substantially equals that input current and bias current which flows through each said additional transistor to maintain a substantially constant current gain characteristic.

2. The inverting amplifier of claim 1 wherein at least the transistors are monolithically fabricated on a single semiconductor chip.

3. The inverting amplifier of claim 1 wherein said means biases the transistors in their linear region of operation.

4. The inverting amplifier of claim 2 wherein said means biases the transistors in their linear region of operation.

5. The inverting amplifier of claim 1 wherein:
a predetermined number *m* of common emitter transistor amplifiers is provided having substantially matching base-emitter characteristics, having their base electrodes connected directly to each other, having their emitter electrodes connected directly to each other and having their collector electrodes connected directly to each other; and
a predetermined number *n* of input circuit transistors is provided having base-emitter characteristics substantially matching those of the amplifiers and each having its base and collector electrodes connected directly to the base electrodes of the transistor amplifiers and each having its emitter electrode connected directly to the emitter electrode of the transistor amplifiers to obtain a total amplifier output current equal to *m*/*n* times the sum of the input and bias currents.

6. The inverting amplifier of claim 2 wherein:
a predetermined number *m* of common emitter transistor amplifiers is provided having substantially matching base-emitter characteristics, having their base electrodes connected directly to each other, having their emitter electrodes connected directly to each other and having their collector electrodes connected directly to each other; and
a predetermined number *n* of input circuit transistors is provided having base-emitter characteristics substantially matching those of the amplifiers and each having its base and collector electrodes connected directly to the base electrodes of the transistor amplifiers and each having its emitter electrode connected directly to the emitter electrode of the transistor amplifiers to obtain a total amplifier output current equal to *m*/*n* times the sum of the input and bias currents.

7. The inverting amplifier of claim 3 wherein:
a predetermined number *m* of common emitter transistor amplifiers is provided having substantially matching base-emitter characteristics, having their base electrodes connected directly to each other, having their emitter electrodes connected directly to each other and having their collector electrodes connected directly to each other; and
a predetermined number *n* of input circuit transistors is provided having base-emitter characteristics substantially matching those of the amplifiers and each having its base and collector electrodes connected directly to the base electrodes of the transistor amplifiers and each having its emitter electrode connected directly to the emitter electrode of the transistor amplifiers to obtain a total amplifier output current equal to *m*/*n* times the sum of the input and bias currents.

8. The inverting amplifier of claim 1 wherein said means biases the transistors at a selected level at which said input circuit presents a predetermined low impedance.

9. The inverting amplifier of claim 2 wherein said means biases the transistors at a selected level at which said input circuit presents a predetermined low impedance.

10. The inverting amplifier of claim 3 wherein said means biases the transistors at a selected level at which said input circuit presents a predetermined low impedance.

11. The inverting amplifier of claim 4 wherein said means biases the transistors at a selected level at which said input circuit presents a predetermined low impedance.

12. The inverting amplifier of claim 5 wherein said means biases the transistors at a selected level at which said input circuit presents a predetermined low impedance.

13. An inverting amplifier having a gain characteristic which is substantially independent of variations in temperature and bias current comprising:
more than one common emitter transistor amplifier, each having base, emitter and collector electrodes, having substantially matching base-emitter characteristics, having their base electrodes connected directly to each other, having their emitter electrodes connected directly to each other and having their collector electrodes connected directly to each other;
an input circuit for said amplifiers including:
at least one additional transistor having base-emitter characteristics which substantially match those of the transistor amplifiers, having its base and collector electrodes connected directly to the base electrodes of the transistor amplifiers and having its emitter electrode connected directly to the emitter electrodes of the transistor amplifiers; and
means supplying a predetermined bias current to said direct connection between said base and collector electrodes to operate the additional transistors and transistor amplifiers at a selected level to produce a collector output current in each transistor amplifier which is substantially equal to that bias current which flows through each said additional transistor to maintain a substantially constant current gain characteristic.

14. An inverting amplifier having a gain characteristic which is substantially independent of variations in temperature and bias current comprising:
at least one common emitter transistor amplifier having base and emitter electrodes;
an input circuit for said amplifier including:
more than one additional transistor having base-emitter characteristics which substantially match those of the transistor amplifier, each having its base and collector electrodes connected directly to the base electrode of the transistor amplifier and each having its emitter electrode connected directly to the emitter electrode of the transistor amplifier; and
means supplying a predetermined bias current to the junction between said base and collector electrodes to operate the transistors at a selected level, whereby the collector output current of each transistor amplifier substantially equals that bias current which flows through each said additional transistor to maintain a substantially constant current gain characteristic.

15. An inverting amplifier having a gain characteristic which is substantially independent of variations in temperature and bias current comprising:
at least one common emitter transistor amplifier having base and emitter electrodes;
an input circuit for said amplifier including:
at least one additional transistor having base-emitter characteristics which substantially match those of the transistor amplifier, having its base and collector electrodes connected directly to the base electrode of the transistor amplifier and having its emitter electrode connected directly to the emitter electrode of the transistor amplifier;
means supplying a predetermined bias current to the junction between said base and collector electrodes to operate the transistors at a selected level, whereby the collector output current of each transistor amplifier substantially equals that bias current which flows through each said additional transistor to maintain a substantially constant current gain characteristic;
wherein said means biases the transistors in their linear region of operation;
a direct current amplifier having its input coupled to the output of the inverting amplifier; and a negative feedback network, including said bias means, coupling the output of the direct current amplifier to the input of said inverting amplifier and assuring the operation of both amplifiers in their linear region.

16. The inverting amplifier of claim 15 wherein at least the transistors are monolithically fabricated on a single semiconductor chip.

17. The inverting amplifier of claim 15 wherein said means biases the transistors at a selected level at which said input circuit presents a predetermined low impedance.

18. The inverting amplifier of claim 16 wherein said means biases the transistors at a selected level at which said input circuit presents a predetermined low impedance.

19. A current translating circuit comprising:

a predetermined number *m* of first transistors of one conductivity type having substantially matching base-emitter voltage-current characteristics, having their base electrodes connected directly to each other, having their collector electrodes connected directly to each other and having their emitter electrodes connected to each other and adapted for connection to a reference voltage;

a predetermined number *n* of additional transistors of said one conductivity type having base-emitter voltage-current characteristics substantially matching those of the first transistors, having their base and collector electrodes connected directly to the base electrodes of the first transistors and having their emitter electrodes connected directly to the emitter electrodes of the first transistors;

at least one of the numbers *n* and *m* being an integer greater than one; and means supplying a predetermined bias current *Ib* to the junction between said base and collector electrodes of the additional transistors and the base electrodes of the first transistors to operate the transistors at a selected level to produce a collector output current in each of the first transistors which is substantially equal to the current *Ib/n* which flows through each of said additional transistors, thereby producing a total collector current in the first transistors equal to *mIb/n*.

References Cited

UNITED STATES PATENTS 3,320,439 5/1967 Widlar ------------ 307—88.5

FOREIGN PATENTS 1,141,338 12/1962 Germany.

OTHER REFERENCES

Widlar, "Monolithic Operational Amplifier," Electronic Design News, November 1964, pp. 18–21.

ROY LAKE, *Primary Examiner.*

J. B. MULLINS, *Assistant Examiner.*